(12) United States Patent
Kadoi

(10) Patent No.: US 10,262,924 B2
(45) Date of Patent: Apr. 16, 2019

(54) SEMICONDUCTOR DEVICE AND ELECTRONIC APPARATUS

(71) Applicant: ABLIC Inc., Chiba-shi, Chiba (JP)

(72) Inventor: Kiyoaki Kadoi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/936,738

(22) Filed: Mar. 27, 2018

(65) Prior Publication Data

US 2018/0286786 A1 Oct. 4, 2018

(30) Foreign Application Priority Data

Mar. 29, 2017 (JP) ................. 2017-065908

(51) Int. Cl.
*H01L 23/48* (2006.01)
*H01L 23/49* (2006.01)
*H01L 23/00* (2006.01)
*H01L 23/482* (2006.01)
*H01L 23/055* (2006.01)
*H01L 23/495* (2006.01)
*H05K 3/00* (2006.01)

(52) U.S. Cl.
CPC .............. *H01L 23/49* (2013.01); *H01L 23/055* (2013.01); *H01L 23/4822* (2013.01); *H01L 23/49555* (2013.01); *H01L 24/30* (2013.01); *H01L 24/33* (2013.01); *H05K 3/00* (2013.01); *H01L 2224/4805* (2013.01); *H01L 2224/48092* (2013.01)

(58) Field of Classification Search
CPC .............. H01L 2224/48092; H01L 2224/4805
See application file for complete search history.

(56) References Cited

U.S. PATENT DOCUMENTS

| 4,769,744 A * | 9/1988 | Neugebauer | ............ H01L 23/32 257/719 |
| 6,320,268 B1 * | 11/2001 | Lang | ....................... H01L 24/72 257/177 |
| 7,989,838 B2 * | 8/2011 | Ku | .......................... F21V 14/02 257/99 |
| 2017/0089730 A1 * | 3/2017 | Utermoehlen | ......... G01D 5/243 |

FOREIGN PATENT DOCUMENTS

| JP | H07-235628 A | 9/1995 |
| JP | 2002-93978 A | 3/2002 |

* cited by examiner

*Primary Examiner* — Nicholas J Tobergte
(74) *Attorney, Agent, or Firm* — Brinks Gilson & Lione

(57) ABSTRACT

Provided is a semiconductor device enabling highly accurate adjustment of a mounting height at a time when the semiconductor device is mounted on an assembly board, and an electronic apparatus. A linear lead is extracted from a bottom surface of a cylindrical resin sealing body covering a semiconductor chip, and a plurality of helical leads are arranged so as to wind around the linear lead, to thereby form a multi-helical structure. The plurality of helical leads forming the multi-helical structure has the same pitch.

15 Claims, 7 Drawing Sheets

SEMICONDUCTOR DEVICE AND ELECTRONIC APPARATUS

RELATED APPLICATIONS

This application claims priority under 35 U.S.C. § 119 to Japanese Patent Application No. 2017-065908 filed on Mar. 29, 2017, the entire content of which is hereby incorporated by reference.

BACKGROUND OF THE INVENTION

1. Field of the Invention

The present invention relates to a semiconductor device enabling suitable adjustment of a mounting height with respect to an assembly board on which the semiconductor device is mounted, and an electronic apparatus.

2. Description of the Related Art

FIG. 8 is a side view of an electronic apparatus having a related-art semiconductor device mounted on an assembly board.

Leads 12 of a semiconductor device 11 are mounted on an assembly board 13 with a solder 9, and the assembly board 13 and the semiconductor device 11 are electrically connected to each other. When the semiconductor device 11 has mounted thereon an element configured to detect magnetism, for example, a magnetic sensor, a distance 15 between the semiconductor device 11 and an object of measurement (for example, a magnet) whose sensing is intended, greatly affects detection sensitivity of the semiconductor device 11. The distance 15 between the semiconductor device 11 that serves as a sensor and the object of measurement is an important factor for detection sensitivity of the semiconductor device 11, and hence it is required to adjust a mounting height 14 of the semiconductor device 11 with respect to the assembly board 13 with high accuracy.

In Japanese Patent Application Laid-open H 7-235628, there is disclosed an electronic apparatus in which a plurality of lead pins of a semiconductor integrated circuit device are inserted in corresponding mounting holes of a substrate having circuit wiring, with fixing members that are made of a metal and interposed between the semiconductor integrated circuit device and the substrate, and the semiconductor integrated circuit device is fixed to the substrate with the fixing members that are made of a metal and mounted at predetermined positions of the lead pins.

Further, in Japanese Patent Application Laid-open 2002-93978, there is disclosed a semiconductor lead structure in which intermediate portions of a plurality of leads are each bent into an arch shape so as to protrude laterally, and a semiconductor device is fixed to a wiring board through use of the bent portions.

However, in the electronic apparatus disclosed in Japanese Patent Application Laid-open H 7-235628, the semiconductor integrated circuit device is fixed to the substrate with the fixing members mounted at the predetermined positions of the lead pins each having a straight shape. There is, therefore, a large height variation, and it is difficult to control the mounting height with high accuracy.

Further, according to the semiconductor lead structure disclosed in Japanese Patent Application Laid-open 2002-93978, the mounting height of the semiconductor device with respect to an assembly board can be set to a predetermined height, but the position of each bent portion is fixed, with the result that a customer who mounts the semiconductor device on the assembly board cannot freely adjust the mounting height. Consequently, there is a problem in that a large number of products being different only in lead shape while having the same electrical characteristics as the semiconductor device are manufactured for respective customers, resulting in more complicated manufacturing management.

SUMMARY OF THE INVENTION

The present invention has been made in view of the above-mentioned circumstances, and it is an object of the present invention to provide a semiconductor device enabling highly accurate adjustment of a mounting height at a time when the semiconductor device is mounted on an assembly board, and an electronic apparatus.

In view of the foregoing, the present invention employs the following measures.

There is provided a semiconductor device having a plurality of leads extracted from a sealing body covering a semiconductor chip, the semiconductor device including:

a linear lead extracted from one principal surface of the sealing body and extends in a direction perpendicular to the one principal surface; and a helical lead separated from the linear lead and winds around the linear lead in a helical manner.

Further, there is provided an electronic apparatus including the semiconductor device mounted on an assembly board, in which the assembly board to which the plurality of helical leads are joined has through-holes through which the plurality of helical leads pass, and in which the through-holes each have a shape in conformity with corresponding one of the plurality of helical leads.

Through use of the above-mentioned measures, it is possible to provide the semiconductor device enabling highly accurate adjustment of a mounting height at a time when the semiconductor device is mounted on an assembly board, and the electronic apparatus.

DETAILED DESCRIPTION OF THE EMBODIMENTS

Now, with reference to the drawings, a semiconductor device of the present invention is described.

Figure 1:
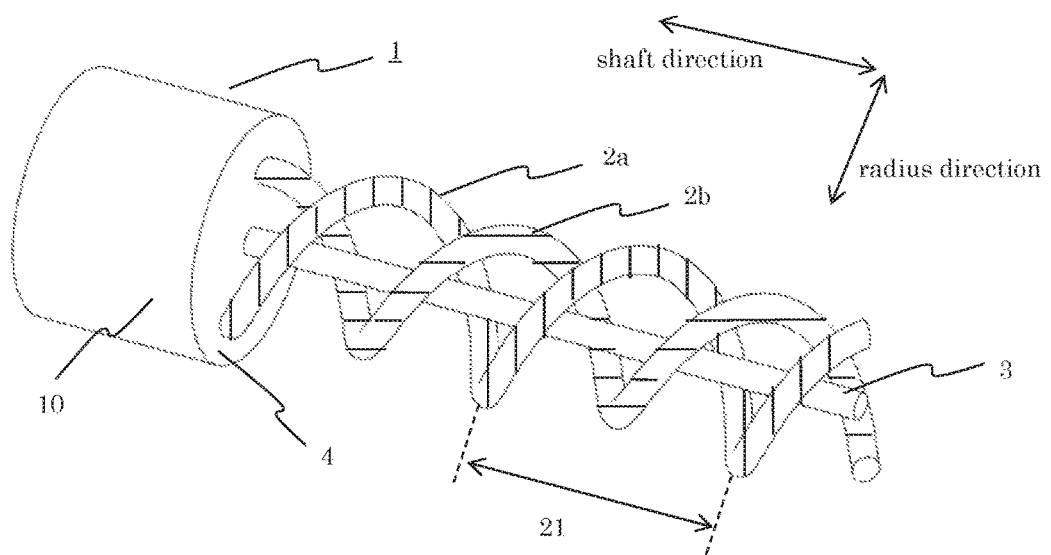
FIG. 1 is a perspective view of a semiconductor device according to a first embodiment of the present invention.

FIG. 1 is a perspective view of a semiconductor device according to a first embodiment of the present invention.

A semiconductor device 1 according to the first embodiment of the present invention includes a cylindrical resin sealing body 10 covering a semiconductor chip (not shown) with a resin, and a plurality of leads 2a, 2b, and 3 extending from one principal surface 4 of the resin sealing body 10, that is, a bottom surface of the resin sealing body 10 in a perpendicular direction. In the resin sealing body 10, the plurality of leads 2a, 2b, and 3 and electrodes on the semiconductor chip are electrically connected to each other. The plurality of leads include one linear lead 3 and a plurality of helical leads 2a and 2b which are separated from the linear lead 3 and wind around the linear lead 3 in a helical manner. The one linear lead 3 linearly extends in an shaft direction of the resin sealing body 10 substantially from a center of the one principal surface 4, and the helical leads 2a and 2b helically extend along the shaft direction from the vicinity of an outer periphery in the radius direction of the one principal surface 4 with circle shape, to thereby form a multi-helical structure. The helical direction in this case may be any one of a right-handed direction and a left-handed direction, and the plurality of helical leads has the same winding direction. A radius r being a distance from a center of the linear lead 3 to the helical lead 2a in the one principal surface 4 is equal to a radius r being a distance from the center of the linear lead 3 to the helical lead 2b in the one principal surface 4, and the radius r is invariably constant even when the helical leads 2a and 2b repeatedly wind around. Further, a helical pitch 21 of the helical lead 2a is invariably constant, and the helical lead 2b also has the same helical pitch 21. As described later, the height accuracy at a time when the semiconductor device 1 is mounted on an assembly board varies depending on the magnitude of the helical pitch 21.

In the foregoing, the resin sealing body is described as the sealing body for a semiconductor chip. However, the present invention is not limited to the resin sealing body, and a semiconductor device may be constructed through use of a sealing body covering a semiconductor chip with a metal can. Further, the multi-helical structure formed of a plurality of helical leads is described as an example, but one helical lead may be used.

Figure 2:
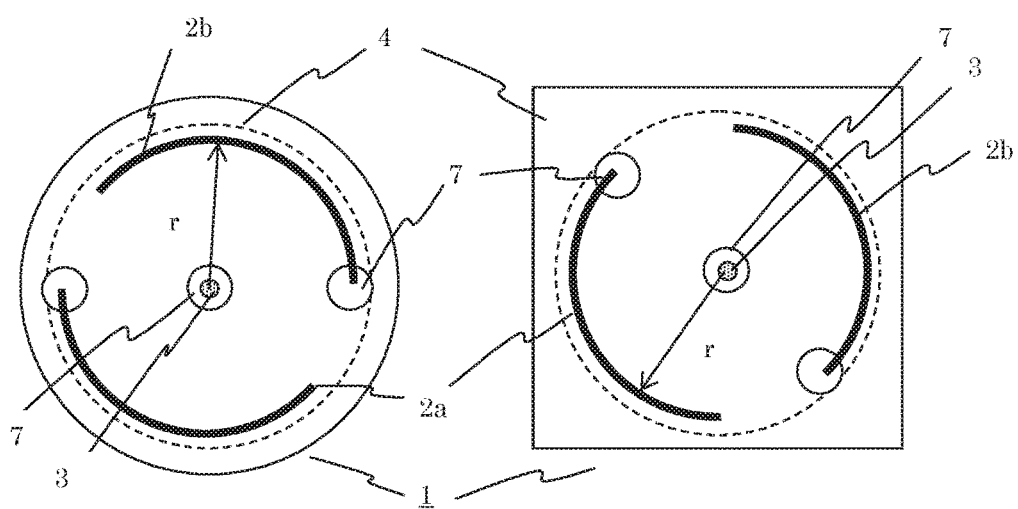
FIG. 2 is a bottom view of the semiconductor device according to the first embodiment of the present invention.

FIG. 2 is a bottom view of the semiconductor device 1 according to the first embodiment of the present invention.

The left side of FIG. 2 is an example of the semiconductor device 1 including a cylindrical resin sealing body, and the right side thereof is an example of the semiconductor device 1 including a rectangular resin sealing body. A plurality of lead extending portions 7 are arranged on the one principal surface 4 of the resin sealing body. One lead extending portion 7 is arranged in a center portion of the one principal surface 4, and two lead extending portions 7 are arranged in a peripheral portion of the one principal surface 4. The helical lead 2a extends from one of the lead extending portions 7 in the peripheral portion, and the helical lead 2b extends from the other of the lead extending portions 7 in the peripheral portion. The linear lead 3 extends from the lead extending portion 7 in the center portion. The dotted line illustrated in FIG. 2 indicates a circle with the center portion of the one principal surface 4 being a center, and the helical leads 2a and 2b are formed along a circumference of the circle. The radius r being a distance from the center of the linear lead 3 to the helical lead 2a in the one principal surface 4 is equal to the radius r being a distance from the center of the linear lead 3 to the helical lead 2b in the one principal surface 4. Further, the lead extending portions 7 corresponding to the helical leads 2a and 2b are arranged at symmetrical positions with the lead extending portion 7 corresponding to the linear lead 3 being a center. When the mounted semiconductor chip has four terminals, three lead extending portions 7 are arranged in the peripheral portion, and the three lead extending portions 7 are positioned on the circumference equally divided at a center angle of 120°. When the number of terminals increases in this manner, it is only required that the lead extending portions 7 be equally arranged on the circumference depending on the number.

Figure 3:
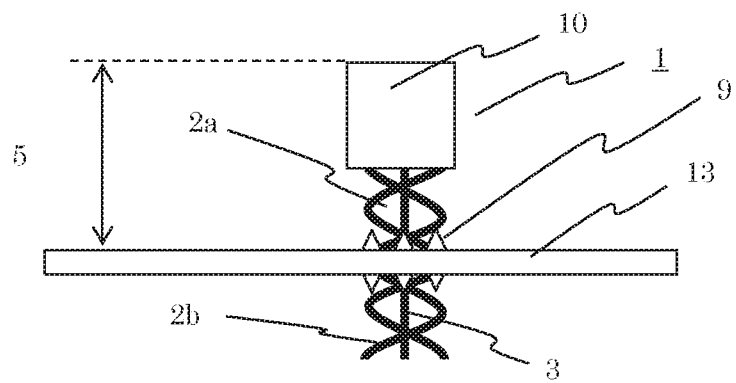
FIG. 3 is a side view of an electronic apparatus having the semiconductor device according to the first embodiment of the present invention mounted on an assembly board.

FIG. 3 is a side view of an electronic apparatus having the semiconductor device according to the first embodiment of the present invention mounted on an assembly board.

The helical leads 2a and 2b and the linear lead 3 extending from the resin sealing body 10 of the semiconductor device 1 are pushed, while being rotated like a screw, in a plurality of through-holes formed in the assembly board 13 in advance until the semiconductor device 1 achieves a predetermined mounting height 5 and a predetermined direction. The assembly board 13 is joined to the helical leads 2a and 2b and the linear lead 3 through the solder 9. Then, unnecessary leads projecting from a lower surface of the assembly board 13 are cut to complete manufacturing of the electronic apparatus. The helical pitch 21 of each of the helical leads 2a and 2b is suitably determined. When the helical pitch 21 is increased, the push-in amount per rotation increases. Meanwhile, when the helical pitch 21 is decreased, the push-in amount per rotation decreases. When the strictly management of the height accuracy of the semiconductor device 1 is intended, it is advantageous to decrease the helical pitch 21.

Figure 4A:
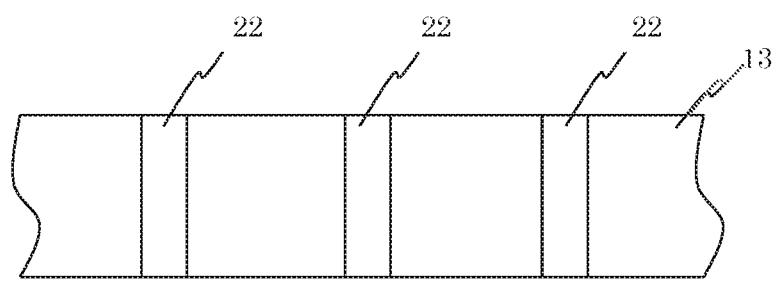
FIG. 4A and FIG. 4B are each an enlarged view of through-hole portions of the assembly board on which the semiconductor device according to the first embodiment of the present invention is mounted.
Figure 4B:
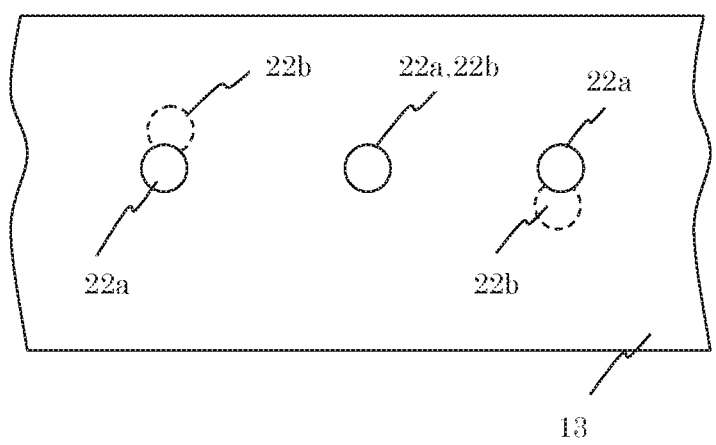

FIG. 4A and FIG. 4B are each an enlarged view of through-hole portions of the assembly board 13 on which the semiconductor device 1 according to the first embodiment of the present invention is mounted. FIG. 4A is a sectional view, and FIG. 4B is a plan view.

As illustrated in FIG. 4A, through-holes 22 penetrating the assembly board 13 from an upper surface thereof to the lower surface thereof are formed in three portions. The through-hole 22 at the center serves as a hole for the linear lead 3, and the through-holes 22 at both ends serve as holes for the helical leads 2a and 2b. Although it is hard to understand the following configuration from the sectional view, the through-hole 22 at the left end is inclined from the front of the drawing sheet to the slightly right side in the backward direction successively from the upper surface to the lower surface, and the through-hole 22 at the right end is inclined from the back of the drawing sheet to the slightly left side in the frontward direction successively from the upper surface to the lower surface. The through-hole 22 at the center is perpendicular to a substrate plane of the assembly board 13.

Next, a state of inclination of each of the through-holes 22 is described with reference to the plan view of FIG. 4B. Through-hole inlets 22a of the through-holes 22 in the three portions are aligned laterally in a row. However, in each of the through-holes 22 at both the ends, a through-hole outlet 22b is displaced from the through-hole inlet 22a without completely superimposing the through-hole inlet 22a. In the through-hole 22 at the left end, the through-hole outlet 22b is displaced from the through-hole inlet 22a to the slightly right side in the upward direction of FIG. 4B. This displacement indicates that the through-hole 22 is inclined from the front to the slightly right side in the backward direction successively from the upper surface to the lower surface. Further, in the through-hole 22 at the right end, the through-hole outlet 22b is displaced from the through-hole inlet 22a to the slightly left side in the downward direction of FIG. 4B. This displacement indicates that the through-hole 22 is inclined from the back to the slightly left side in the frontward direction successively from the upper surface to the lower surface. The through-hole inlets 22a and the through-hole outlets 22b of the through-holes 22 at both the ends are each arranged along a circumference drawn by the corresponding helical lead in plan view. Further, the degree of inclination of the through-hole 22 is matched with inclination of the corresponding helical lead and is determined based on the helical pitch and radius of the helical lead. When the semiconductor device is mounted on the assembly board, the semiconductor device can be mounted at a predetermined height with high accuracy as long as the rotation number at a time of mounting is known since the degree of inclination is known.

When it is difficult to form the through-holes 22 having the above-mentioned shapes, the through-holes 22 at both the ends may be formed into through-holes perpendicular to the substrate plane of the assembly board 13. However, in this case, the through-holes should have a large width so that the helical leads 2a and 2b can pass through the through-holes.

Figure 5:
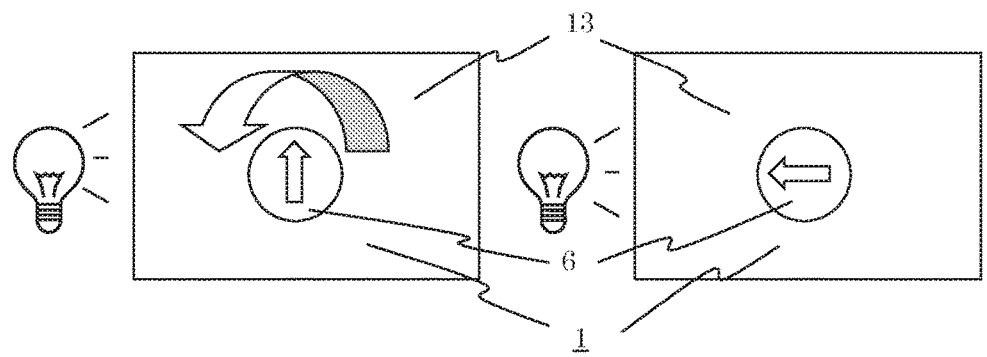
FIG. 5 is a top view of the semiconductor device according to the first embodiment of the present invention when being mounted on the assembly board.

FIG. 5 is a top view of the semiconductor device 1 according to the first embodiment of the present invention mounted on the assembly board 13.

As described above, the mounting height can be changed with high accuracy by inserting the helical leads 2a and 2b in the through-holes 22 of the assembly board 13 and rotating the semiconductor device 1. In addition, according to the semiconductor device 1 of the first embodiment of the present invention, the mounting direction as well as the mounting height can also be suitably determined. For example, when the semiconductor device 1 is a sensor having high directivity, the semiconductor device 1 can be easily mounted in a direction (sensing direction) 6 providing fair detection sensitivity with respect to an object of detection (for example, light or sound) whose sensing is intended. In the left side of FIG. 5, a luminous body (bulb shape) and the sensing direction 6 of the semiconductor device 1 are not matched with each other, but the object of detection can be detected with high detection sensitivity merely by rotating the semiconductor device 1 leftward by 90°. This is because the helical leads 2a and 2b are arranged along the circumference of the circle with respect to the one principal surface 4 of the semiconductor device 1. Further, though the change in the sensing direction 6 of the semiconductor device 1 changes the mounting height 5 thereof, a change amount of a mounting height that is changed along with adjustment of the sensing direction 6 can be made small, and falls within an allowable range when the helical pitch 21 of each of the helical leads 2a and 2b is sufficiently small.

Figure 6:
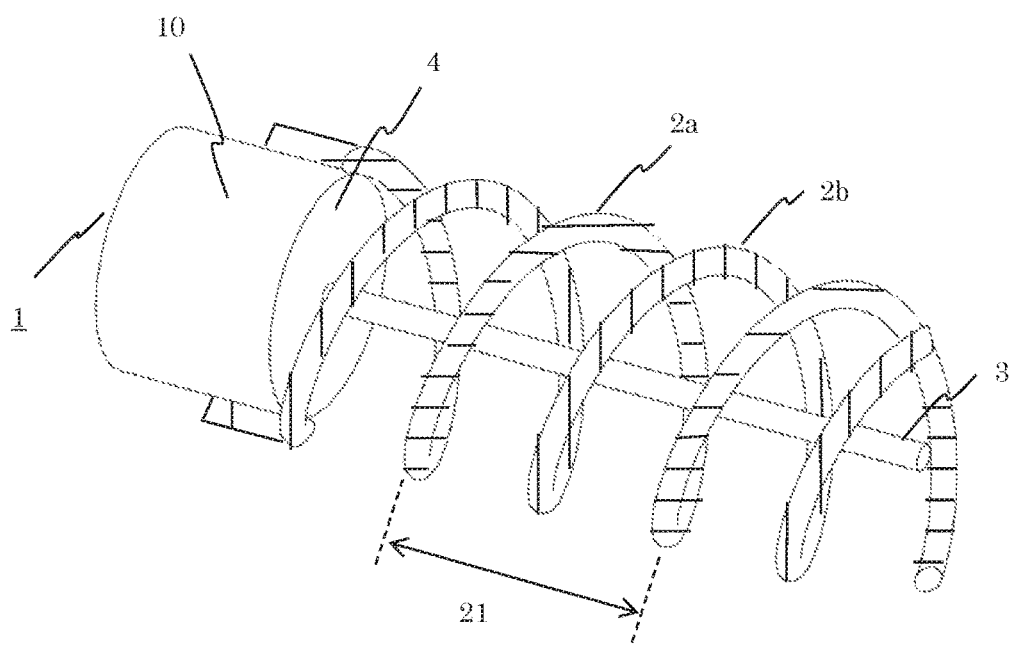
FIG. 6 is a perspective view of a semiconductor device according to a second embodiment of the present invention.

FIG. 6 is a perspective view of a semiconductor device according to a second embodiment of the present invention.

In FIG. 1, the helical leads 2a and 2b have the lead extending portions arranged on the one principal surface 4, that is, the bottom surface of the cylindrical resin sealing body 10. However, in the semiconductor device according to the second embodiment of the present invention, the lead extending portions are arranged on a side surface of the cylinder instead of the one principal surface 4. With such configuration, the radius r of each of the helical leads 2a and 2b can be set to be larger than the radius of the cylindrical resin sealing body 10, and hence the semiconductor device 1 having high vibration resistance can be obtained. The helical leads 2a and 2b have a shape obtained by combining two springs. When the helical leads 2a and 2b are joined to the assembly board 13, vibration is transmitted from outside to the helical leads 2a and 2b of the semiconductor device 1 through the assembly board 13, and the helical leads 2a and 2b are subjected to fatigue fracture to cause mounting failure in some cases. The helical leads 2a and 2b serve as the springs to alleviate vibration stress, to thereby prevent fatigue fracture of the helical leads 2a and 2b. In the second embodiment, the radius of each of the helical leads 2a and 2b is set to be larger. Thus, the semiconductor device 1 has a high position restoring property, and returns to its set position even when the semiconductor device 1 receives vibration, with the result that more stable sensing can be performed.

Figure 7:
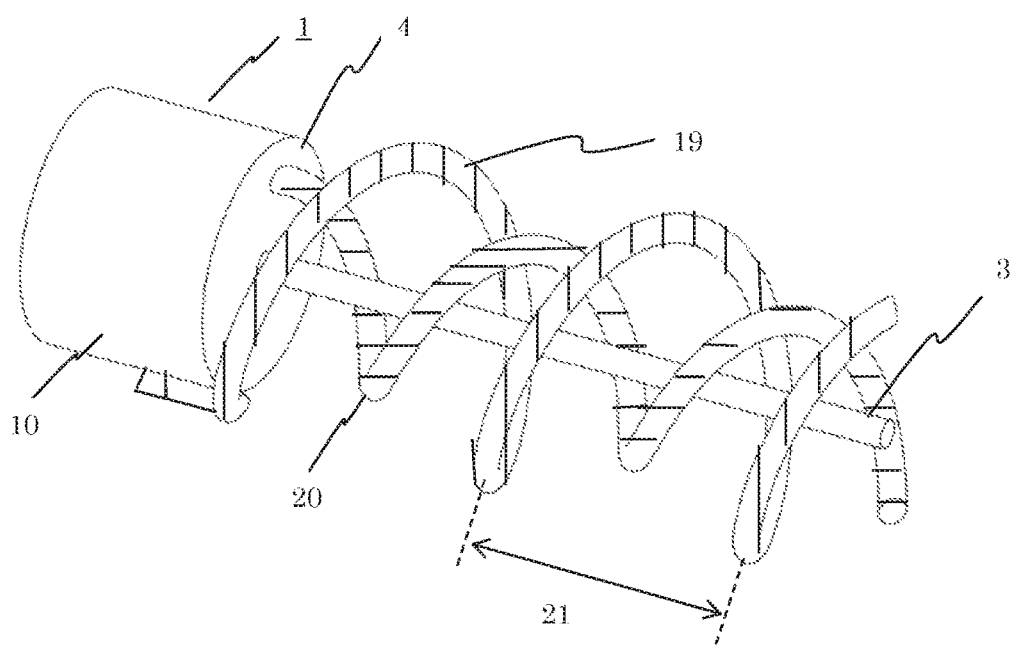
FIG. 7 is a perspective view of a semiconductor device according to a third embodiment of the present invention.
Figure 8:
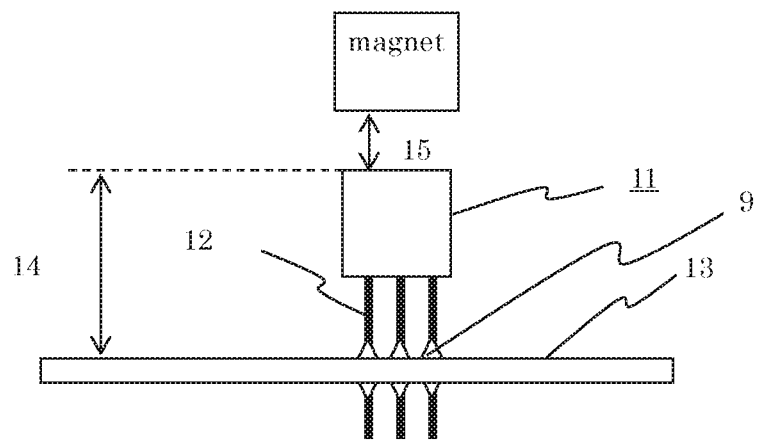
FIG. 8 is a side view of an electronic apparatus having a related-art semiconductor device mounted on an assembly board.

FIG. 7 is a perspective view of a semiconductor device according to a third embodiment of the present invention.

The third embodiment is a combination of the first embodiment and the second embodiment. One helical lead 20 has a lead extending portion arranged in the vicinity of the outer periphery of the one principal surface 4 and helically extends from the lead extending portion. Further, the other helical lead 19 has a lead extending portion arranged on the side surface of the cylindrical resin sealing body 10 and helically extends from the lead extending portion. The two helical leads 19 and 20 forming a multihelical structure have the same helical pitch 21, but have different radii. The helical lead 19 extending from the side surface of the cylinder is formed to have a radius that is larger than that of the helical lead 20 extending from the bottom surface of the cylinder. With such configuration, the semiconductor device 1 that exhibits vibration resistance to even vibrations having different frequencies can be obtained.

Description has been given of the following: the semiconductor device of the present invention can be mounted on the assembly board at a suitable height; the semiconductor device of the present invention can be mounted on the assembly board in a suitable direction; and the semiconductor device of the present invention has vibration resistance. The lead of the semiconductor device of the present invention has a shape similar to that of a coil, and can also be used as an antenna. That is, according to the semiconductor device of the present invention, the lead portion can also serve as an antenna in addition to the element configured to transmit an electric signal.

What is claimed is:

1. A semiconductor device having a plurality of leads extending from a sealing body covering a semiconductor chip, the semiconductor device, comprising:
a linear lead extending from one principal surface of the sealing body and in a direction perpendicular to the one principal surface; and
a helical electrical lead connected to an electrode on the semiconductor chip and separated from the linear lead and winding around the linear lead in a helical manner.

2. A semiconductor device according to claim 1, wherein the helical electrical lead has a lead extending portion on the one principal surface.

3. A semiconductor device according to claim 1, wherein the helical electrical lead has a lead extending portion on a surface of the sealing body different from the one principal surface.

4. A semiconductor device having a plurality of leads extending from a sealing body covering a semiconductor chip, the semiconductor device comprising:
   a linear lead extending from one principal surface of the sealing body in a direction perpendicular to the one principal surface; and
   a helical electrical lead separated from the linear lead and winding around the linear lead in a helical manner,
   wherein the helical electrical lead extends from a side surface of the sealing body.

5. A semiconductor device according to claim 1, wherein the helical electrical lead has a constant helical pitch.

6. A semiconductor device according to claim 2, wherein the helical electrical lead has a constant helical pitch.

7. A semiconductor device according to claim 3, wherein the helical electrical lead has a constant helical pitch.

8. A semiconductor device according to claim 4, wherein the helical lead has a constant helical pitch.

9. An electronic apparatus, comprising the semiconductor device of claim 1 mounted on an assembly board,
   wherein the helical electrical lead comprises a plurality of helical electrical leads and the assembly board includes through-holes and the plurality of helical electrical leads pass through the through-holes, and
   wherein the through-holes each have a shape in conformity with a corresponding one of the plurality of helical electrical leads.

10. An electronic apparatus, comprising the semiconductor device of claim 2 mounted on an assembly board,
    wherein the helical electrical lead comprises a plurality of helical electrical leads and the assembly board includes through-holes the plurality of helical electrical leads pass through the through-holes, and
    wherein the through-holes each have a shape in conformity with a corresponding one of the plurality of helical electrical leads.

11. An electronic apparatus, comprising the semiconductor device of claim 3 mounted on an assembly board,
    wherein the helical electrical lead comprises a plurality of helical electrical leads and the assembly board includes through-holes the plurality of helical electrical leads pass through the through-holes, and
    wherein the through-holes each have a shape in conformity with a corresponding one of the plurality of helical electrical leads.

12. A semiconductor device according to claim 1, wherein the helical electrical lead includes a plurality of helical electrical leads defining a multi-helical structure.

13. A semiconductor device according to claim 12, wherein the plurality of helical electrical leads each have a same radius in a direction perpendicular to an axis direction of the resin sealing body.

14. A semiconductor device according to claim 12, wherein the plurality of helical electrical leads each have different radii in a direction perpendicular to an axis direction of the resin sealing body.

15. A semiconductor device according to claim 12, wherein a lead extending portion of at least one of the plurality of helical electrical leads is on the one principal surface, and a lead extending portion of at least another of the plurality of helical electrical leads is on a surface of the sealing body different from the one principal surface.

* * * * *